United States Patent [19]

Tchon

[11] 4,091,278

[45] May 23, 1978

[54] TIME-INDEPENDENT CIRCUIT FOR MULTIPLYING AND ADDING CHARGE

[75] Inventor: Wallace Edward Tchon, Phoenix, Ariz.

[73] Assignee: Honeywell Information Systems Inc., Phoenix, Ariz.

[21] Appl. No.: 715,270

[22] Filed: Aug. 18, 1976

[51] Int. Cl.² .................. G11C 19/28; H01L 29/78
[52] U.S. Cl. ................................. 307/221 D; 357/24
[58] Field of Search .............. 357/24; 307/221 D, 304

[56] References Cited

U.S. PATENT DOCUMENTS

| | | | |
|---|---|---|---|
| 3,758,794 | 9/1973 | Kosonocky | 357/24 |
| 3,806,772 | 4/1974 | Early | 357/24 |
| 3,867,645 | 2/1975 | Weimer | 357/24 |
| 3,903,543 | 9/1975 | Smith | 357/24 |
| 3,987,475 | 10/1976 | Ibrahim | 357/24 |
| 4,986,198 | 10/1976 | Kosonocky | 357/24 |

OTHER PUBLICATIONS

Sequin et al., Charge Transfer Devices, Academic Press, N.Y. (7/75) pp. 25–27, 47–59, 152, 153, 179, 244.

Primary Examiner—William D. Larkins
Assistant Examiner—Gene M. Nunson
Attorney, Agent, or Firm—William W. Holloway, Jr.; Ronald T. Reiling; Nicholas Prasinos

[57] ABSTRACT

A charge-coupled device (CCD) for amplifying and accumulating charge comprises a first CCD line, a plurality of time-independent CCD charge amplifiers each having an input gate connected to a surface potential tap on a respective one of the charge storage regions of the first CCD line, and a second CCD line for accumulating the charge which has been amplified by the charge amplifiers. The device permits the coherent accumulation of the charge in a time-independent manner. Arithmetic, logic, and complex signal processing functions may be conducted by suitable configurations of the charge amplifiers.

3 Claims, 2 Drawing Figures

TIME-INDEPENDENT CIRCUIT FOR MULTIPLYING AND ADDING CHARGE

CROSS-REFERENCE TO RELATED INVENTIONS

The present invention is related to the following inventions, all assigned to the same assignee as the present invention:

1. "Charge Injectors for CCD Registers", Ser. No. 592,147, filed June 30, 1975, now U.S. Pat. No. 3,980,902, of W. E. Tchon.
2. "Charge Detectors for CCD Registers", Ser. No. 591,667, filed June 30, 1975, now U.S. Pat. No. 4,021,682, of B. R. Elmer et al.
3. "Charge Multiplying Differential Amplifier", Ser. No. 644,655, filed Dec. 29, 1975, of W. E. Tchon et al.
4. "Time-Independent CCD Charge Amplifier", Ser. No. 715,271 filed on even date herewith, now U.S. Pat. No. 4,040,077 of W. E. Tchon.

BACKGROUND OF THE INVENTION

The invention relates generally to charge transfer devices and, more particularly, to a time-independent CCD circuit for multiplying and adding charge.

The basic operation of charge-coupled devices has been explained in detail in the technical and patent literature, but a brief summary of the operation of such devices may facilitate an understanding of the present invention. While the structure of a charge-coupled device will be given in terms of specific semiconductor material types, it will be understood that in general where P-type material is specified, N-type material may be substituted and vice versa.

A typical charge-coupled device may consist of a P-type silicon substrate (in which electrons are normally the minority signal carriers) with a silicon dioxide insulating layer superimposed on its surface. An arrangement of conducting electrodes is deposited on the surface of the insulating layer.

When clock voltages are applied to predetermined groupings of the electrodes, some of the electrons in the vicinity of each electrode, assuming that electrons are initially present (as a result, for example, of injection into the device), will form a discrete packet of charge and move one charge-coupled element, or unit cell, in a predetermined direction for each full clock cycle. The packets of charge move in the predetermined direction as a result of the continuous lateral displacement of the local potential well in which they find themselves. Charge-coupling is thus the collective transfer of all the mobile electric charge stored within a semiconductor storage region to a similar, adjacent storage region by the external manipulation of clock voltages.

The quantity of charge capable of being stored in the mobile packet can vary widely, depending on the applied voltages and on the capacitance of the storage regions. The amount of electric charge in each packet can represent information. Charge-coupled devices have utility in photosensor arrays, delay lines, shift registers, buffer memories, sequential-access memories, fast-access scratchpad memories, refresh memories, and other information storage and transfer mechanisms.

Various types of CCD charge amplification and distribution circuits are known in the prior art. Several of these are described in *Charge Transfer Devices*, Sequin and Tompsett, Academic Press, Inc., New York, 1975. For example, at page 56 et seq. this publication describes a floating gate distributed amplifier in which charge is sampled at particular points in a first CCD device, amplified, and input into corresponding points in a second, larger CCD device, so that the signal initially present in the first CCD device is amplified coherently in the second CCD device. U.S. Pat. No. 3,806,772 describes a similar floating gate CCD distributed amplifier. At page 216 et seq. the aforementioned publication further discloses the use of CCD's for signal processing in the form of transversal filters having either fixed or variable tap weights. These devices utilize a circuit in which a first CCD line is non-destructively tapped at several locations, each tap being multiplied by a different weighting coefficient. The weighted taps are then combined in a differential summing amplifier or other suitable accumulator circuit. The publication also discloses several two-dimensional transfer arrays (p. 261 et seq.) in which charge may be transferred in up to four possible directions from a given charge storage area of the array. Circuits are also described therein for binary adders and multipliers (p. 270 et seq.) by means of which charge is multiplied and accumulated in specific ways.

In the known prior art CCD circuits for amplifying and accumulating charge, the amount of charge which is amplified by the individual charge amplifiers is dependent upon the length of time the input gates of the amplifiers are turned on and upon the threshold voltages of the electrodes and the semiconductor substrate. The amplified charge is thus rather imprecise and is influenced both by variations in operational frequency as well as by variations in clock voltages.

SUMMARY OF THE INVENTION

According to a preferred embodiment of the present invention, a time-independent CCD circuit for multiplying and adding charge is disclosed in which certain disadvantages of the known prior art CCD charge amplifying and accumulating circuits are overcome.

The present invention comprises a first CCD line, a plurality of time-independent CCD charge amplifiers, and a second CCD line for accumulating the amplified charge. Each of the charge amplifiers has an input gate connected to a surface potential tap on a respective charge storage region of the first CCD line, and each of the charge amplifiers amplifies the charge sensed at the surface potential tap by a predetermined factor, which factor may be the same or different for all of the charge amplifiers. The charge amplifiers may be configured in various ways to carry out arithmetic, logic or complex signal processing operations.

OBJECTS OF THE INVENTION

Accordingly, it is a principal object of the present invention to provide a time-independent CCD circuit for amplifying and accumulating charge.

It is also an object of the invention to provide a CCD circuit for amplifying and accumulating charge which is highly flexible of configuration, and which lends itself readily to arrangements for arithmetic, logic, or complex signal processing operations.

BRIEF DESCRIPTION OF THE DRAWINGS

The invention will be described with reference to the accompanying drawings, wherein.

DETAILED DESCRIPTION OF THE PREFERRED EMBODIMENT

Figure 1:
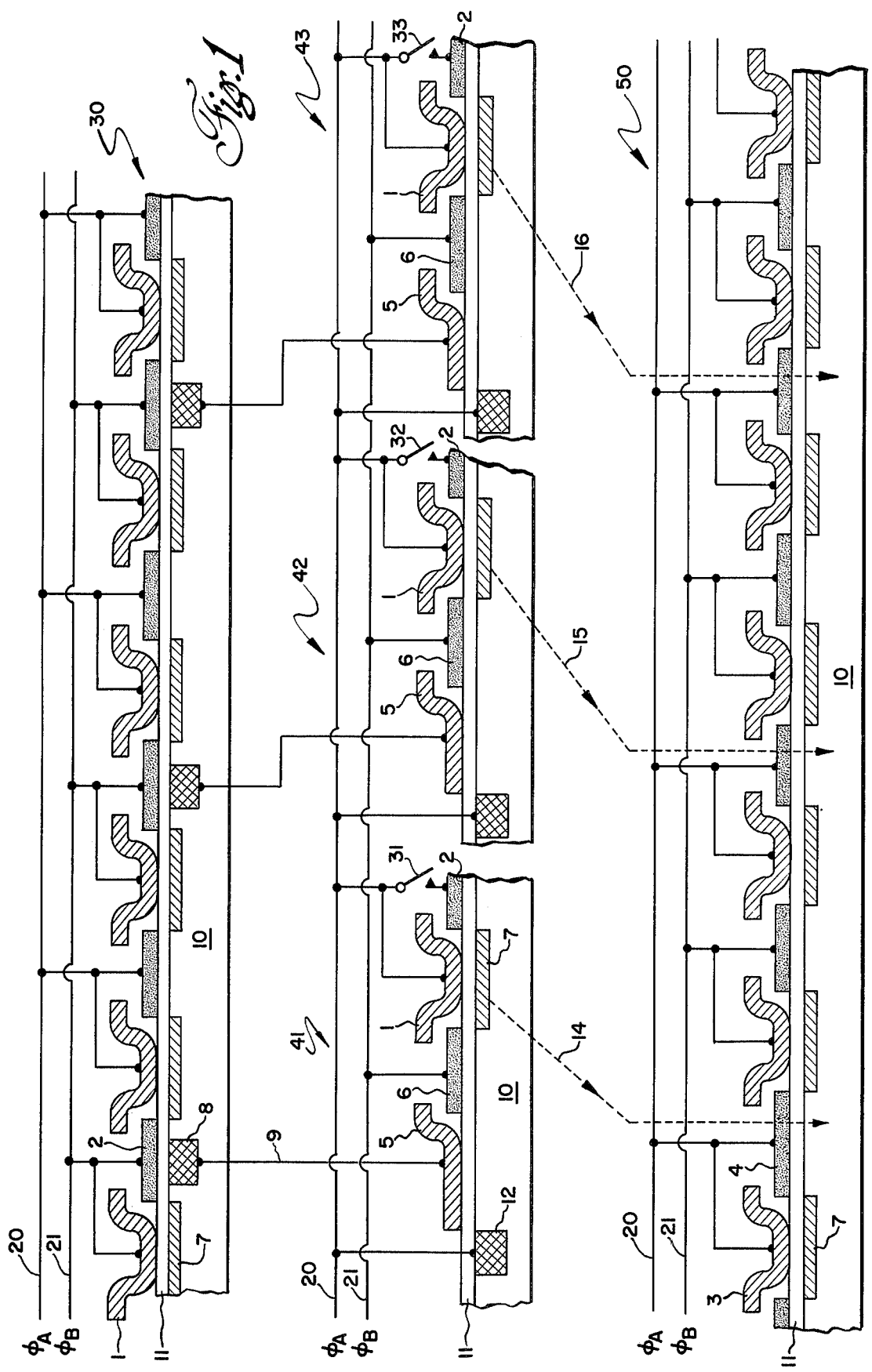
FIG. 1 is a schematic showing a cross-section of a portion of a preferred embodiment of a time-independent CCD circuit for amplifying and accumulating charge.

Referring now to the drawings, and in particular to FIG. 1, there is shown a cross-sectional schematic diagram of several portions of a time-independent CCD circuit for amplifying and accumulating charge, according to a preferred embodiment of the invention. A first CCD line 30 is shown in the upper portion of FIG. 1. Three time-independent CCD charge amplifiers 41-43 are shown in the middle portion of FIG. 1. The lower portion of FIG. 1 illustrates a second CCD line 50 whose function is to accumulate the outputs from the individual CCD charge amplifiers 41-43 shown in the middle portion of FIG. 1. The first CCD line 30, the individual CCD charge amplifiers 41-43, and the second CCD line 50 may all be located on a common substrate 10. Alternatively, one or more may be located on separate semiconductor substrates.

The first CCD line 30 comprises a semiconductor substrate 10 of P-type semiconductor material, a thin silicon dioxide layer 11 of relatively uniform thickness overlying the substrate 10, and a plurality of electrode pairs each of which comprises a first electrode member 1 and a second electrode member 2. The two members 1, 2 of each electrode pair are electrically isolated from one another by an insulative layer of silicon dioxide (not shown), which layer may be grown as a normal part of the known silicon gate process. The electrode pairs 1, 2 comprise polysilicon (polycrystalline silicon which has been diffused with impurity atoms) in the preferred embodiment shown in FIG. 1. The composition of the electrodes could alternatively be metal, such as aluminum or gold.

In the substrate 10 and underlying the first member 1 of each electrode pair are P+ barrier implant regions 7. The doping density of implant regions 7 in the preferred embodiment is approximately $10^{17}$ atoms/cm$^3$, and they may be formed by a boron dose of approximately $2 \times 10^{12}$ atoms/cm$^2$ to the substrate 10.

At each of those locations in the first CCD line 30 where it is desired to sample in a non-destructive fashion the signal which is momentarily present, a heavily compensated N++ diffusion region 8 is formed. Each N++ diffusion region 8 is located in the substrate 10 beneath the second member 2 of a particular electrode pair. The region beneath the second member 2 of each electrode pair serves as the charge storage region of the CCD line 30. In the preferred embodiment, the N++ diffusion regions 8 are formed by diffusing phosphorous atoms into the P-type silicon substrate in standard doping densities (e.g., $10^{18}$ to $10^{21}$ atoms/cm$^3$). In the preferred embodiment, the diffusion regions 8 are doped to approximately $10^{20}$ atoms/cm$^3$. As seen in FIG. 1, the diffusion region 8 associated with the charge storage electrode 2 of one particular electrode pair 1, 2 is electrically connected by appropriate conducting means 9 to an input gate 5 of one of the time-independent CCD charge amplifiers.

Charge packets move from left to right through the first CCD line 30, through the charge amplifiers 41-43, and through the second CCD line 50 under the influence of a two-clock system comprising a $\phi_A$ line 20 and $\phi_B$ line 21. Alternate electrode pairs are connected to clock line 20, while the remaining electrode pairs are connected to clock line 21. The wave-forms transmitted over clock lines 20 and 21 may be similar to those shown and described in related invention No. 4.

The design of the individual time-independent CCD charge amplifiers 41-43 may be identical to that described in related invention No. 4. While three charge amplifiers are shown in FIG. 1, it will be understood that any number of such amplifiers may be employed depending upon the desired arithmetic, logic, or signal processing operation. As mentioned above, the individual charge amplifiers 41-43 may be located on a common semiconductor substrate 10, or they may be located on separate substrates. Each charge amplifier comprises, in addition to the substrate 10, a thin oxide layer 11 which may be identical to thin oxide layer 11 of the first CCD line 30 shown in the upper portion of FIG. 1. Each charge amplifier further comprises an input gate 5, which may be formed of second-layer polysilicon, and a first charge storage electrode 6, which may be formed of first-layer polysilicon. In addition each charge amplifier contains one or more electrode pairs each comprising first electrode member 1 and a second electrode member 2. The charge amplifier electrode pairs 1, 2 may be identical to those of the first CCD line 30; i.e., they may be physical extensions of the electrode members of the first CCD line 30. Alternatively, the charge amplifier electrode pairs may be physically separate from those of the first CCD line 30. As with the first CCD line 30, a P+ barrier implant region 7 underlies the first member 1 of each electrode pair of the charge amplifiers. In addition an N++ diffusion region 12 is located in the substrate 10 adjacent to the input gate 5 of the charge amplifier. The N++ diffusion region 12 is electrically connected to the phase $\phi_A$ clock line 20. As mentioned earlier, the input gate 5 is electrically connected by line 9 to the N++ diffusion region 8 of the first CCD line 30. The first charge storage electrode 6 is connected to the phase $\phi_B$ clock line 21. The first electrode pair is connected to the phase $\phi_A$ clock line 20, as are the remaining odd-numbered electrode pairs, whereas the second and remaining even-numbered electrode pairs are connected to the phase $\phi_B$ clock line 21. In the preferred embodiment shown in FIG. 1, all of the charge amplifiers 41-43 are of identical construction, and the electrical connections to clock lines 20 and 21 and to the N++ diffusion regions 8 of the first CCD line 30 are identical.

The individual charge amplifiers 41-43 receive a certain amount of charge, depending upon whether the signal momentarily stored in the corresponding charge storage region of the first CCD line 30 is an arithmetic "1" or "0". If the signal transmitted over line 9 to the input gate 5 of a particular charge amplifier is an arithmetic "0", an arithmetic "0" will be injected into the charge amplifier and propagated through its active CCD channel. On the other hand, if the signal received at input gate 5 is an arithmetic "1", the charge amplifier multiplies such signal by a fixed factor, such factor being dependent upon the electrical and geometrical characteristics of the charge amplifier, as will be described in greater detail below. Reference may also be had to related invention No. 4 for a more complete description of the operation of the charge amplifier.

The second CCD line 50, illustrated in the lower portion of FIG. 1, may be of identical construction to the first CCD line 30 which is illustrated in the upper portion of FIG. 1, except that the second CCD line 50 lacks the surface potential taps in the form of N++ diffusion regions 8. The second CCD line 50 may be located on the same substrate 10 as the first CCD line 30 and the charge amplifiers 41-43, or it may be located on a separate substrate. As with the first CCD line 30, alternate electrode pairs, each comprising a first electrode member 3 and a second electrode member 4, are connected to the phase $\phi_A$ clock line 20, and the remaining electrode pairs are connected to the phase $\phi_B$ clock line 21. It is also desirable for the size of the charge storage regions in the second CCD line 50 to be larger than those of the first CCD line 30, since the second CCD line 50 functions as an accumulator and must be capable of storing larger charge packets than those which move through the first CCD line 30. The electrode members of charge amplifiers 41-43 are extensions of those of the second CCD line 50 according to the preferred embodiment. Thus the first electrode pair 3, 4 of CCD line 50 is an extension of the first electrode pair 1, 2 of charge amplifier 41. Both electrode pairs are clocked by $\phi_A$. Likewise, the third electrode pair of CCD line 50 is an extension of the first electrode pair of charge amplifier 42, and the fifth electrode pair of CCD line 50 is an extension of the first electrode pair of charge amplifier 43. Dotted line 14 in FIG. 1 indicates the direction of charge movement from the charge transfer region beneath charge transfer electrode member 1 of charge amplifier 41 to the charge storage region beneath charge storage electrode member 4 of the first electrode pair of CCD line 50. Likewise dotted lines 15 and 16 indicate the direction of charge movement from the charge transfer regions of charge amplifiers 42 and 43 to the charge storage regions beneath the third and fifth electrode pairs, respectively, of CCD line 50. It should be understood that while in the preferred embodiment illustrated in FIG. 1 substantially all charge is directed from the charge amplifiers 41-43 into the accumulator CCD line 50, alternative embodiments can be made in which the amplified charge packet in one or more charge amplifiers is split, with one portion going into the accumulator CCD line 50 and the other remaining in the charge amplifier to move incrementally through an output CCD portion thereof under the influence of clocks $\phi_A$ and $\phi_B$. Should the charge packet be desired to be split in this manner, switches 31-33 are closed, allowing clock $\phi_A$ to be applied to the charge storage electrode member 2 of each charge amplifier 41-43, and thereby causing a portion of the charge to be retained in the CCD portion of the amplifiers 41-43. Where all charge is desired to be moved into the accumulator CCD line 50, switches 31-33 are left open. It will be understood that switches 31-33 are illustrated merely to show two alternative embodiments, and that for an optimized implementation of either embodiment appropriate circuitry may be utilized in place of the switches.

The specific process steps required to produce the P+ and N++ regions in the substrate 10 will be apparent to one skilled in the art. Likewise, the optimum manner for connecting the N++ regions 8 to the input gates 5 of the charge amplifiers and for connecting the clock lines 20 and 21 to the electrode pairs, the N++ diffusion regions 12, and the first charge storage electrode 6 of the charge amplifier will also be apparent to the practitioner of ordinary skill.

The operation of the preferred embodiment of the invention shown in FIG. 1 is such that when a signal representing an arithmetic "0" is resident in the first tapped charge storage region of CCD line 30 and is transmitted to the input gate 5 of charge amplifier 41 over line 9, an arithmetic "0" is injected into charge amplifier 41 and propagated from left to right from one charge storage region to the next by the application of clocks $\phi_A$ and $\phi_B$. However, when an arithmetic "1" is transmitted over line 9 to the input gate 5 of charge amplifier 41, such signal is multiplied by a predetermined constant by charge amplifier 41 prior to its being propagated through the CCD output portion of charge amplifier 41. That is, if an amount of charge Q is initially sensed in the first tapped charge storage region of the first CCD line 30, such quantity of charge Q is multiplied by a certain factor, say A, in charge amplifier 41, and the product AQ is momentarily stored in the charge storage region beneath the first electrode pair of CCD accumulator line 50. During the next half of the complete clock cycle the initial charge packet Q is transferred to the charge storage region beneath the second electrode pair of CCD line 30, and the product AQ is transferred to the charge storage region beneath the second electrode pair of CCD accumulator line 50. During the first half of the next clock cycle, Q and AQ are transferred to the charge storage regions beneath the third electrode pairs of CCD lines 30 and 50 respectively, and simultaneously Q is multiplied by a factor B, which may be the same as A or different, in charge amplifier 42. The product BQ is added to the product AQ in the charge storage region beneath the third electrode pair of CCD accumulator line 50. One full clock cycle later the product CQ, where C represents the amplification factor of charge amplifier 43, is added to the quantity AQ + BQ in the charge storage region beneath the fifth electrode pair of CCD accumulator line 50.

Figure 2:
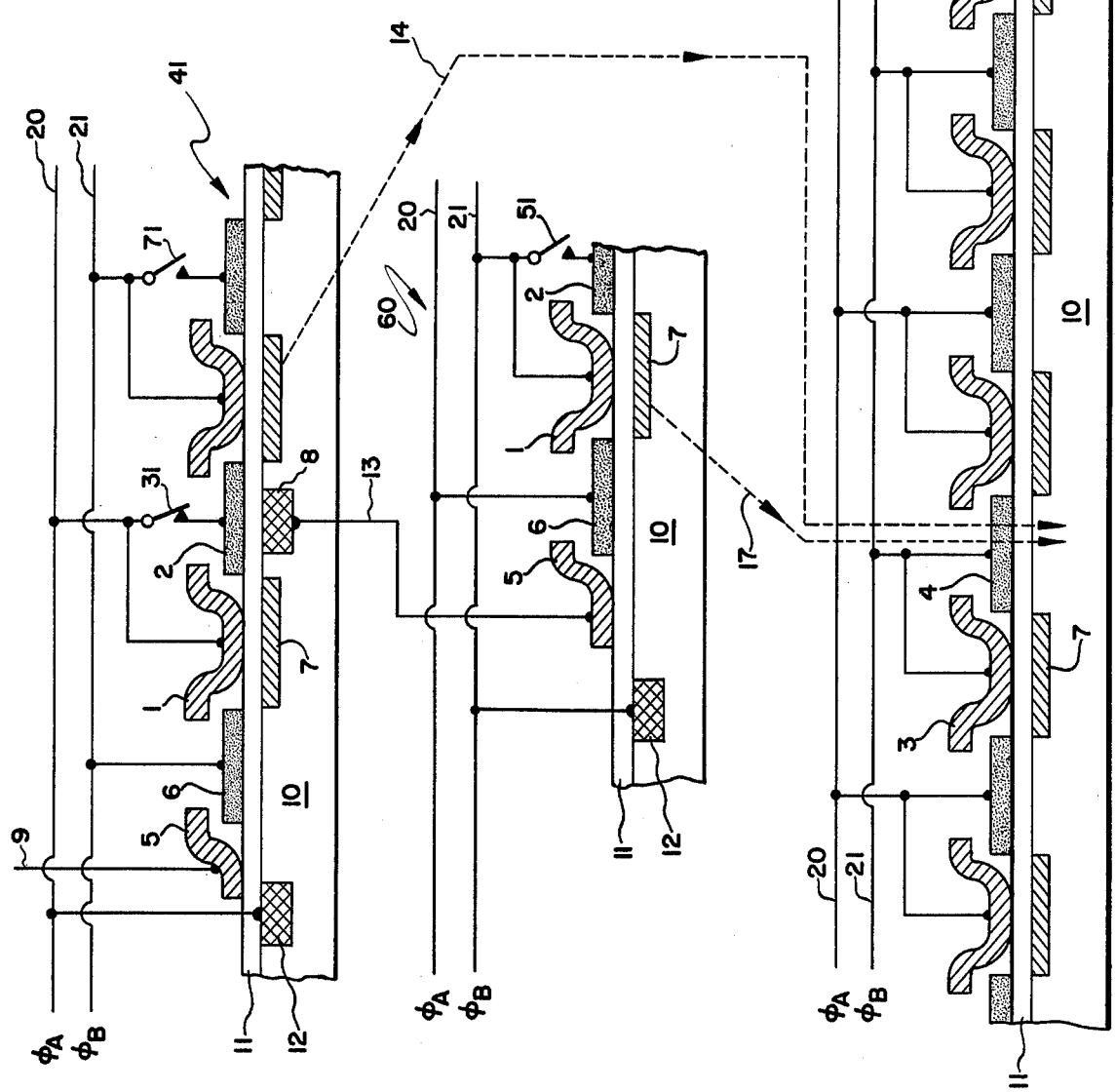
FIG. 2 is a schematic showing a cross-section of a portion of an alternative embodiment of a time-independent CCD circuit for amplifying and accumulating charge.

With reference now to FIG. 2, a cross-sectional schematic diagram of a portion of an alternative embodiment of the present invention is illustrated. In the upper portion of FIG. 2 is shown a charge amplifier 41, which is identical in all respects to that illustrated in the middle portion of FIG. 1, except that a surface potential tap has been made to the charge storage region beneath the second member 2 of the first electrode pair in the form of a N++ diffusion region 8. It will be apparent to one of ordinary skill that the surface potential tap may be made at any one of the charge storage regions of charge amplifier 41 and that more than one surface potential tap may be made on the charge storage regions of the charge amplifier. It will be noted that switch 31 of charge amplifier 41 is now closed since it is desired to transport charge some distance through the CCD portion of the amplifier.

In the middle portion of FIG. 2 is shown an additional charge amplifier 60, the input gate 5 of which is connected by means of line 13 to the N++ diffusion region 8 of the previous charge amplifier 41. The additional charge amplifier 60 may amplify the signal received from the previous charge amplifier 41 by the same factor used by the previous charge amplifier or by an entirely different factor. The charge which is sampled from the first charge amplifier 41 is done so nondestructively.

The lower portion of FIG. 2 shows a CCD accumulator line 50, which may be similar in all respects to that illustrated in the lower portion of FIG. 1.

Appropriate consideration must be given to making the proper clock and output connections to and from the individual charge amplifiers 41 and 60. Thus it will be noted that the first electrode pair of charge amplifier 41 of FIG. 2 is clocked by clock line 20, as is the first electrode pair in the CCD accumulator line 50 shown in the lower portion of FIG. 2, which first electrode pairs are connected either by virtue of their being part of the same electrode structure or by an appropriate electrical connection. The first electrode pair of charge amplifier 60 is clocked by clock line 21 (clock $\phi_B$), as is the second electrode pair in the CCD accumulator line 50, to which the first electrode pair of charge amplifier 60 is also connected.

In this embodiment, the second electrode pair in the CCD accumulator line 50 is a physical extension of the first electrode pair of charge amplifier 60, and dotted line 17 illustrates the direction of charge movement from the charge transfer region beneath the charge transfer electrode 1 of the first electrode pair of amplifier 60 to the charge storage region beneath charge storage electrode 4 of the second electrode pair of CCD accumulator line 50.

Also in this embodiment an appropriate connection is made between the second electrode pair of charge amplifier 41 and the second electrode pair of CCD accumulator line 50, in order to shunt the product AQ into the accumulator line. Switch 71 is opened to disconnect the $\phi_B$ clock from the charge storage electrode member of the second electrode pair of charge amplifier 41. Dotted line 14 represents the direction of movement of the charge packet AQ from the charge transfer region beneath the charge transfer electrode of the second electrode pair of charge amplifier 41 to the charge storage region beneath the charge storage electrode of the second electrode pair of CCD accumulator line 50.

The alternative embodiment of the invention illustrated in FIG. 2 operates in the following manner. If a charge quantity Q representing an arithmetic "0" is transmitted over line 9 to charge amplifier 41, an arithmetic "0" is merely accumulated in CCD accumulator line 50. If on the other hand a charge quantity Q representing an arithmetic "1" is transmitted over line 9 from the charge storage region of the first CCD line 30 (FIG. 1), charge amplifier 41 multiplies the charge quantity Q by a predetermined factor A, and the product AQ is momentarily stored in the charge storage region beneath the first charge storage electrode 6 of charge amplifier 41. During the next half of the clock cycle AQ is transferred one CCD cell to the right in charge amplifier 41 to the tap region 8, where charge amplifier 60 senses AQ and multiplies it by its own amplification factor B. The quantity ABQ is transferred to the charge storage region beneath the second electrode pair of the CCD accumulator line 50. During this same portion of the clock cycle the quantity AQ is also transferred from charge amplifier 41 to the charge storage region beneath the second electrode pair of CCD accumulator line 50. The quantity ABQ + AQ is therefore accumulated at this time in the charge storage region beneath the second electrode pair of CCD accumulator line 50. It will be noted that this embodiment permits simultaneous multiplication and addition in one clock cycle.

It will be apparent to the ordinary practitioner that many different configurations of charge amplifiers may be made intermediate the first CCD line 30 and the CCD accumulator line 50. The output from a particular charge amplifier may be connected to CCD line 50 either ahead of or behind that of another charge amplifier. It will also be apparent that by appropriate combinations of the charge amplifiers, all basic arithmetic functions, as well as many logic functions, may be performed. In addition, by successively linking together a plurality of charge amplifiers in the manner illustrated in FIG. 2, charge may be cascaded. It will also be appreciated that the present invention can be configured to implement complex mathematical algorithms and signal processing applications. While the operation of the present invention has been explained using arithmetic "1's" and "0's" it should be understood that the invention is fully capable of processing both analog and digital signals.

Typical values for the dimensions of the various elements of the preferred embodiment shown in FIG. 1 are 3,000A for the polysilicon electrode members and 1,000A for the channel oxide. It will be understood that these values are not necessarily optimized, and that one skilled in the art will be capable of making many modifications to the preferred embodiment according to the desired performance requirements. It should be understood that the relative dimensions of the various elements in the drawing are not to be considered relatively proportional, as they have been distorted for ease in understanding the invention.

It will be apparent to those skilled in the art that the disclosed Time-Independent CCD Circuit for Multiplying and Adding Charge may be modified in numerous ways and may assume many embodiments other than the forms specifically set out and described above. For example, the device may be operated with other than two clock lines. Also, thin oxide layer 6 need not necessarily be of uniform thickness, but may be of a variable thickness depending on the device fabrication process. Further, the P++ regions can be formed either through a diffusion or an ion implant process step. In addition, a capacitive coupling may be substituted for the direct electrical connections between the surface potential taps and the input gates of the charge amplifiers.

Accordingly, it is intended by the appended claims to cover all modifications of the invention which fall within the true spirit and scope of the invention.

What is claimed is:

1. A time-independent charge transfer circuit for amplifying and accumulating charge comprising
    a substrate of a given type of semiconductor material,
    a layer of silicon dioxide overlying one surface of said substrate,
    a plurality of first electrode pairs located on a first portion of said silicon dioxide layer, each of said first electrode pairs comprising a charge transfer electrode and a charge storage electrode, said electrodes of each pair being electrically connected,
    a plurality of clock driver circuits for generating a plurality of different clock pulse trains, a first one of said clock pulse trains being applied to alternate ones of said first electrode pairs during any given clock cycle, and a second one of said clock pulse trains being applied to the remaining ones of said first electrode pairs during any given clock cycle,
    a first conduction region is said substrate underlying the charge storage electrode of one of said first electrode pairs, said first conduction region comprising semiconductor material of an opposite conductivity type from that of said substrate, a first time-independent charge amplifier located on a second portion of said silicon dioxide layer and including an input electrode electrically connected to said first conduction region, a second electrode pair electrically connected to said first one of said clock pulse trains, said second electrode pair comprising a charge transfer electrode and a charge storage electrode, said electrodes being electrically connected, a charge storage region located in said substrate beneath said charge storage electrode of said second electrode pair, and second and third conduction regions located in said substrate and comprising semiconductor material of an opposite conductivity type from that of said substrate, said second conduction region being located adjacent to said input electrode of said first charge amplifier and being electrically connected to said first one of said clock pulse trains, and said third conduction region underlying the charge storage electrode of said second electrode pair, a second time-independent charge amplifier located on a third portion of said silicon dioxide layer and including an input electrode electrically connected to said third conduction region, a third electrode pair electrically connected to said second one of said clock pulse trains, said third electrode pair comprising a charge transfer electrode and a charge storage electrode, said electrodes being electrically connected, a charge storage region located in said substrate beneath said charge storage electrode of said third electrode pair, and a fourth conduction region located in said substrate and comprising semiconductor material of an opposite conductivity type from that of said substrate, said fourth conduction region being located adjacent to said input electrode of said second charge amplifier and being electrically connected to said second one of said clock pulse trains, a charge accumulator circuit located on a fourth portion of said silicon dioxide layer and including a plurality of fourth electrode pairs, each of said fourth electrode pairs comprising a charge transfer electrode and a charge storage electrode, said electrodes of each pair being electrically connected, alternate ones of said fourth electrode pairs being electrically connected to said first one of said clock pulse trains and the remaining ones of said fourth electrode pairs being electrically connected to said second one of said clock pulse trains, and a charge storage region located in said substrate beneath each of said charge storage electrodes of said charge accumulator circuit, and means for electrically connecting said charge storage region of said second charge amplifier with one of said charge storage regions of said charge accumulator circuit.

2. The time-independent charge transfer circuit of claim 1 wherein said first charge amplifier amplifies an amount of charge input thereto by a first amplification factor A and said second charge amplifier amplifies an amount of charge input thereto by a second amplification factor B, A and B being different.

3. The time-independent charge transfer circuit of claim 2 wherein said first charge amplifier further comprises an additional electrode pair immediately downstream of and adjacent to said second electrode pair, said additional electrode pair being electrically connected to said second one of said clock pulse trains, said additional electrode pair comprising a charge transfer electrode and a charge storage electrode, said electrodes being electrically connected, and means for electrically connecting the charge storage electrode of said additional electrode pair with the charge storage electrode corresponding to said one of said charge storage regions of said charge accumulator circuit, whereby an amount of charge Q entering said first conduction region is amplified by the factor $A(1+B)$ and transmitted to said one charge storage region of said charge accumulator circuit during one clock cycle.

* * * * *